United States Patent [19]

Willman

[11] Patent Number: 5,356,829
[45] Date of Patent: Oct. 18, 1994

[54] SILICON DEVICE INCLUDING A PN-JUNCTION ACTING AS AN ETCH-STOP IN A SILICON SUBSTRATE

[75] Inventor: Martin Willman, Reutlingen, Fed. Rep. of Germany

[73] Assignee: Robert Bosch GmbH, Stuttgart, Fed. Rep. of Germany

[21] Appl. No.: 775,777

[22] Filed: Oct. 11, 1991

[30] Foreign Application Priority Data

Nov. 9, 1990 [DE] Fed. Rep. of Germany ....... 4035628

[51] Int. Cl.$^5$ .......................................... H01L 21/302
[52] U.S. Cl. ........................................ 437/74; 437/75; 437/228; 437/966; 437/981; 257/419
[58] Field of Search ................... 437/6, 74, 75, 108, 437/109, 947, 981, 59, 81, 22, 225, 228, 966; 257/419

[56] References Cited

U.S. PATENT DOCUMENTS

| | | | |
|---|---|---|---|
| 5,057,455 | 10/1991 | Foo et al. | 437/193 |
| 5,059,546 | 10/1991 | Havemann | 437/59 |
| 5,070,031 | 12/1991 | Zdebel | 437/59 |
| 5,071,510 | 12/1991 | Findler et al. | 156/647 |
| 5,110,373 | 5/1992 | Mauger | 437/966 |

FOREIGN PATENT DOCUMENTS

| | | | |
|---|---|---|---|
| 6002671 | 1/1981 | Japan | 257/419 |
| 6264582 | 12/1981 | Japan | 257/419 |
| 7190366 | 11/1982 | Japan | 257/419 |
| 0080281 | 5/1985 | Japan | 257/419 |
| 1042968 | 3/1986 | Japan | 257/419 |
| 2098971 | 4/1990 | Japan | 257/419 |

OTHER PUBLICATIONS

Haisma et. al, "Jap. Jr. Appl. Phys" (1989) pp. 1426–1443.
Ghaudhi, "VLSI fabrication principles" p. 129 by John Wiley (1982).
Palik et. al, "Ellipsometric study of the etch stop mechanism in heavily doped silicon" J. Elec. Chem. Soc. Jan. 1985, pp. 135–141.
Seidel et. al, "Anisotropic etching of crystalline silicon in alkalline solutions, Influence of dopants" J. Elec. Chem. Soc. vol 137, Nov. 1990.
S. M. Sze, Semiconductor Devices. Physics and Technology, John Wiley & Sons, New York, pp. 472–475 (1985).
Ben Kloeck, et al "Study of Electrochemical Etch-Stop for ... " in IEEE Transactions on Elctron Devices, vol. 36, pp. 663–669 (1989).
S. M. Sze, VLSI Technology, McGraw-Hill International Book Company, Auckland, London, 1983, pp. 57–61.

*Primary Examiner*—R. Bruce Breneman
*Assistant Examiner*—Ramamohan Rao Paladugu
*Attorney, Agent, or Firm*—Michael J. Striker

[57] ABSTRACT

The method of making a silicon device including a pn-junction includes the steps of providing a p-doped monocrystalline silicon substrate (1) with a doping concentration $C_S$; making a pn-junction by forming a first n-doped layer portion (21) directly on one side of the p-doped monocrystalline silicon substrate (1) with a doping concentration $C_D$ greater than the doping concentration $C_S$ of the silicon substrate; depositing epitaxially at least one other n-doped layer portion (22) having a doping concentration $C_E$ on the first n-doped layer portion (21) to form a silicon layer including the first n-doped layer portion and the at least one other n-doped layer portion; and etching a portion of the p-doped monocrystalline silicon substrate (1) so as to form a blind hole extending to the pn-junction from another side of the silicon substrate opposite to the side on which the first n-doped layer portion (21) is formed, the etching being such that the hole ends at the pn-junction.

5 Claims, 2 Drawing Sheets

SILICON DEVICE INCLUDING A PN-JUNCTION ACTING AS AN ETCH-STOP IN A SILICON SUBSTRATE

BACKGROUND OF THE INVENTION

The present invention relates to a method of making a pn-junction in a silicon substrate and, more particularly, to positional stabilization of etching mask boundaries in anisotropic etching of structures in a silicon substrate.

A method of making a pn-junction in a silicon substrate is known, including making a silicon layer on a monocrystalline silicon substrate and doping the silicon layer oppositely from the silicon substrate so that the silicon layer is of a doping type which is opposite to the silicon substrate.

Such methods for doping silicon are described in "Mikromechanik" by A. Heuberger, in Section 3.1.2, pp. 91 to 97, Springer Verlag, 1989. One possibility for doping includes diffusion from the gas phase or doped surface coatings. Another possibility is that the doping atoms can be added to the substrate by an externally produced and accelerated ion beam. Additional engineering methods for layer deposition are described in the above cited reference in Section 3.1.5, pp. 114 to 121, e.g. epitaxial layer formation of layers with predetermined doping profiles.

SUMMARY OF THE INVENTION

According to the invention, the process for making a pn-junction in a silicon substrate includes making the silicon layer from at least two layer portions. A first layer portion is formed directly on the silicon substrate having a doping concentration $C_S$. This first layer portion has a doping concentration $C_D$ such that $C_D$ is greater than $C_S$. At least one additional layer portion with a doping concentration of $C_E$ is deposited epitaxially on the first layer portion.

This method has the advantage that a pn-junction made at standard methods with a definite predetermined depth in a substrate, allows example for positional stabilization of an etch-stop in a silicon substrate.

Other forms of the method of the invention are possible. The first layer portion may be doped by diffusion of doping material into the silicon substrate. The first layer portion may be deposited epitaxially on the silicon substrate. The doping material of the first layer portion with a diffusion coefficient $D<5\times 10^{-13}$ cm²/s at $T=1220°$ C. may be chosen. The silicon layer may be n-doped while the silicon substrate is p-doped. The doping material of the first layer portion may be arsenic or antimony.

The making of micromechanical structures in silicon requires localized thinning or working of silicon substrates. The mechanical behavior of micromechanical structure elements is influenced strongly by their thickness. In the method of the present invention the position of pn-junctions in silicon substrates is very accurately predetermined. The definition and uniformity of the thicknesses of remaining layers may be substantially improved in applications using position stabilized pn-junctions as etch-stop boundaries.

BRIEF DESCRIPTION OF THE DRAWING

The objects, features and advantages of the present invention will now be illustrated in more detail by the following detailed description, reference being made to the accompanying drawing in which.

DETAILED DESCRIPTION OF THE INVENTION

The exact location of the pn-junction made during the production of pn-junctions by diffusion of foreign atoms into a silicon substrate or by epitaxial deposition of layers depends on several factors. These factors include, for example, the doping concentration proportions in the substrate and in the layer deposited on the substrate. The location of the pn-junction also depends on the Autodoping effects during epitaxial and diffusion processes, which for example are influenced by high temperature processes occurring in the course of the processing of the silicon substrate. According to the invention, the position of the pn-junction produced by introduction of a diffuse or epitaxial layer with higher doping concentration $C_D$ as well as the steepness of the doping gradient in the substrate is not influenced by autodoping. It may also very satisfactorily reproducibly shift or displace itself a predetermined amount by diffusion from the diffusion and/or epitaxial layer. Additional layers may be deposited epitaxially above the diffusion and/or epitaxial layer.

Figure 1A:
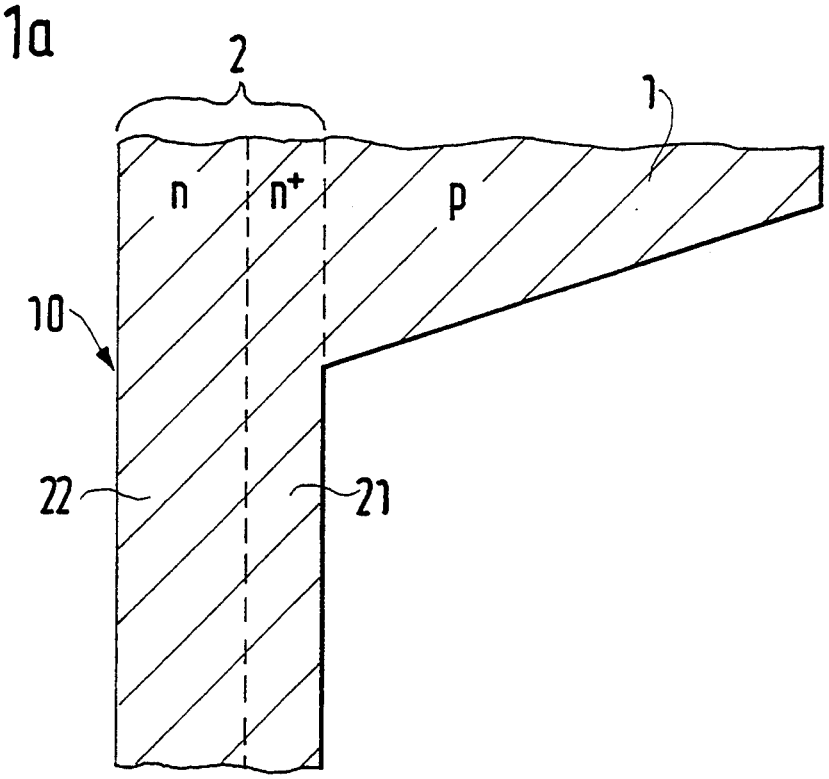
FIG. 1a is a cross-sectional view through a silicon substrate with a pn-junction.
Figure 1B:
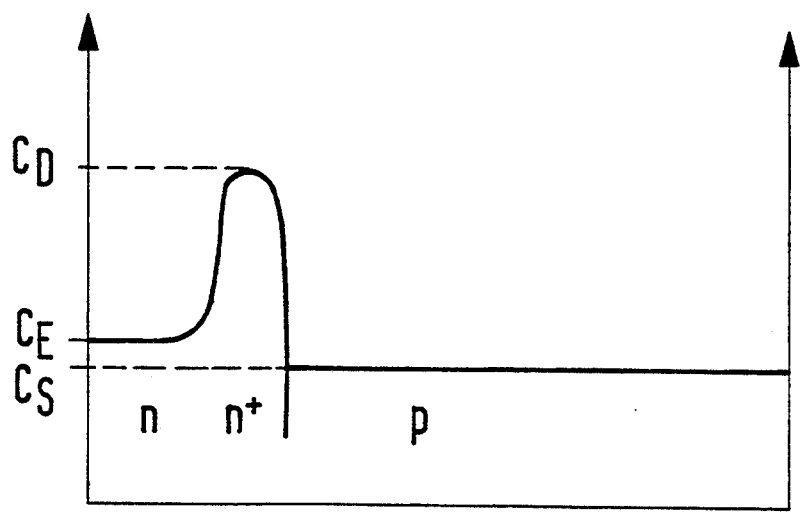
FIG. 1b is a graphical illustration of a doping concentration profile of the silicon substrate showing the concentration of doping material versus the depth in the silicon.

A silicon substrate 10 produced by a method according to the invention is shown in FIG. 1a. A first layer portion 21 is grown on a p-doped monocrystalline silicon substrate 1. The first layer portion 21 is very strongly n-doped and can either be made by diffusion of a suitable doping atom into the substrate or can be epitaxially deposited. The n-doped substrate layer 2 has a second less strongly n-doped layer portion 22 outside of the first very strongly n-doped layer portion 21, which is deposited on the first layer 21 epitaxially. In FIG. 1a a portion of the substrate 1 is etched away. The pn-junction polarized in the gate direction and produced according to the invention acts as an etch-stop boundary. In FIG. 1b the doping concentration proportion in the silicon support or substrate shown in FIG. 1a is illustrated. The substrate 1 has a p-doping with a uniform concentration $C_S$ over its entire depth. The first layer portion 21 is very strongly n-doped with a doping concentration $C_D$, which is substantially above the concentration in the substrate. The additional layer portion 22 immediately adjacent to the first layer portion 21 is similarly n-doped with a doping concentration $C_E$, which is however reduced in comparison to the doping concentration $C_D$ of the first layer portion 21. The selection of the doping concentration $C_E$ of the second layer portion 22 is however independent of that of the silicon substrate 1.

Figure 2:
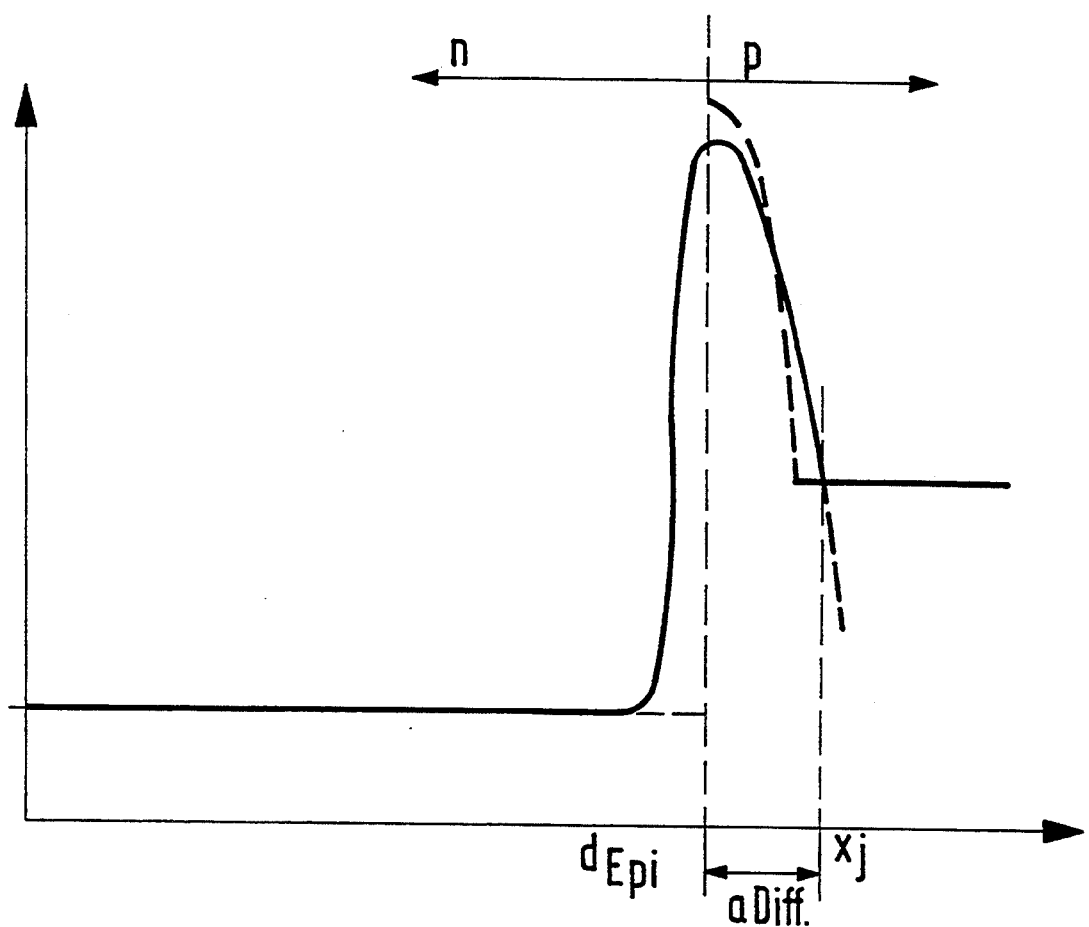
FIG. 2 is a graphical illustration of the doping concentration profile of the silicon substrate at different stages of the process according to the invention.

FIG. 2 shows the doping concentration depends on the silicon depth in different stages of the process. The position of the pn-junction produced according to the invention is indicated with $X_j$. In this example the pn-junction is produced by a doping process prior to the epitaxial deposition process, so that the position $X_j$ of the pn-junction is not influenced by autodoping effects, but is exclusively determined by the controllable amount $a_{Diff}$, which results from solid diffusion processes, and the epitaxial thickness indicated with $d_{Epi}$.

The position of the pn-junction results from the addition of the quantities as follows:

$$X_j = d_{Epi} + a_{auto} + a_{Diff}$$

wherein $a_{auto}$ is the shift of the pn-junction produced by an Autodoping Process. In the methods according to the invention $a_{Auto}$ is zero. The dashed lines in FIG. 2 show the position of the stabilized first layer portion 21 prior to the epitaxial diffusion process. The solid lines describe the doping concentration proportions according to the epitaxial deposition process the diffusion out limited by the solid diffusion process.

In the production of the pn-junction between the p-doped substrate 1 and an n-doped layer 2 an atom with a comparatively small diffusion coefficient, for example Arsenic (As) or Antimony (Sb), is suitable for a first strongly doped layer portion 21. It is also possible to make a pn-junction between an n-doped substrate 1 and a p-doped layer 2. In summary it can be established that the process according to the invention allows production of a pn-junction, whose position is independent of the Autodoping Effects, as long as the doping of the first layer portion 21 is of the same kind as the doping of the second layer portion 22 and the doping concentration $C_D$ of the first layer portion 21 is sufficiently greater than the doping concentration $C_S$ of the substrate. The position of the pn-junction, which is primarily adjusted by diffusion out of the highly doped layer portion 21 in high temperature process, may be displaced reproducibly and a sufficiently satisfactorily predetermined amount. The absolute value of the doping concentrations $C_{Epi}$, $C_D$ and $C_S$ are unimportant.

While the invention has been illustrated and described as embodied in a process for making pn-junctions in a silicon substrate, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

I claim:

1. A method of making a silicon device, said method comprising the steps of:
   a. providing a p-doped monocrystalline silicon substrate (1) with a doping concentration $C_S$;
   b. making a pn-junction by forming a first n-doped layer portion (21) directly on one side of the p-doped monocrystalline silicon substrate (1) with a doping concentration $C_D$ greater than said doping concentration $C_S$ of said silicon substrate;
   c. depositing epitaxially at least one other n-doped layer portion (22) having a doping concentration $C_E$ on said first n-doped layer portion (21) to form a silicon layer comprising the first n-doped layer portion and the at least one other n-doped layer portion; and
   d. etching a portion of said p-doped monocrystalline silicon substrate (1) so as to form a blind hole extending from another side of said silicon substrate opposite to said side on which said first n-doped layer portion (21) is formed in step b) to said pn-junction, said etching being such that said hole ends at said pn-junction.

2. A method as defined in claim 1, wherein the forming of the first n-doped layer portion occurs by diffusing a doping material into the p-doped monocrystalline silicon substrate.

3. A method as defined in claim 2, wherein the doping material has a diffusion coefficient, D, $<5 \times 10^{-13}$ cm$^2$/s at T=1220° C.

4. A method as defined in claim 1, wherein the forming of the first n-doped layer portion occurs by depositing epitaxially.

5. A method as defined in claim 1, wherein the first n-doped layer portion is doped with a doping material selected from the group consisting of arsenic and antimony.

* * * * *